United States Patent
Soejima et al.

(10) Patent No.: US 11,009,556 B2
(45) Date of Patent: May 18, 2021

(54) METHOD OF ESTIMATING DETERIORATED STATE OF SECONDARY BATTERY AND SECONDARY BATTERY SYSTEM

(71) Applicant: TOYOTA JIDOSHA KABUSHIKI KAISHA, Toyota (JP)

(72) Inventors: Takanori Soejima, Toyota (JP); Hiroshi Hamaguchi, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 41 days.

(21) Appl. No.: 16/533,076

(22) Filed: Aug. 6, 2019

(65) Prior Publication Data
US 2020/0072909 A1    Mar. 5, 2020

(30) Foreign Application Priority Data
Aug. 30, 2018  (JP) .............................. JP2018-161398

(51) Int. Cl.
*G01R 31/392* (2019.01)
*G01R 31/389* (2019.01)
*G01R 31/367* (2019.01)

(52) U.S. Cl.
CPC ......... *G01R 31/392* (2019.01); *G01R 31/367* (2019.01); *G01R 31/389* (2019.01)

(58) Field of Classification Search
None
See application file for complete search history.

(56) References Cited

U.S. PATENT DOCUMENTS

| 2003/0052646 A1* | 3/2003 | Minamiura | H01M 10/441 320/122 |
|---|---|---|---|
| 2014/0159736 A1 | 6/2014 | Morimoto et al. | |
| 2015/0276889 A1 | 10/2015 | Osaka et al. | |
| 2018/0208062 A1* | 7/2018 | Kanada | B60L 58/10 |
| 2019/0023132 A1* | 1/2019 | Yonemoto | H01M 10/425 |

(Continued)

FOREIGN PATENT DOCUMENTS

| CN | 101616829 | * 12/2009 | ............ B60W 20/00 |
|---|---|---|---|
| CN | 101678827 | * 3/2010 | ............ B60W 20/15 |

(Continued)

OTHER PUBLICATIONS

Anna Tomaszewska, Lithium-ion batteries, 10 pages, Aug. 16, 2019, (Year: 2019).*

*Primary Examiner* — Tung S Lau

(74) *Attorney, Agent, or Firm* — Sughrue Mion, PLLC

(57) ABSTRACT

A method of estimating a deteriorated state of a battery mounted on a vehicle includes first to third steps. The first step is a step of obtaining a voltage value and a current value of the battery a plurality of times during a data acquisition period and storing the values in a memory. The second step is a step of subjecting the voltage value and the current value during the data acquisition period stored in the memory to Fourier transform and calculating an impedance component for each frequency band based on the voltage value and the current value subjected to Fourier transform. The third step is a step of estimating high-rate deterioration of the battery by comparing a ratio E between a medium-frequency impedance ZM and a low-frequency impedance ZL2 with a reference value K.

5 Claims, 9 Drawing Sheets

(56) References Cited

U.S. PATENT DOCUMENTS

2019/0064282 A1* 2/2019 Haga .................... B60L 3/12
2019/0162796 A1* 5/2019 Soejima ............... G01R 31/392

FOREIGN PATENT DOCUMENTS

| | | | | |
|---|---|---|---|---|
| CN | 103163474 | * | 6/2013 | ......... G01R 31/3675 |
| CN | 103080762 | * | 1/2016 | ......... G01R 31/3679 |
| CN | 107039696 | * | 8/2017 | .......... H10M 10/441 |
| CN | 105612081 | * | 10/2017 | ................ B60L 1/00 |
| CN | 107985302 | * | 5/2018 | ............ B60W 20/14 |
| CN | 110873844 | * | 3/2020 | ........... G01R 31/392 |
| JP | 2005-221487 A | | 8/2005 | |
| JP | 2015-190918 A | | 11/2015 | |
| WO | WO 2010005079 | * | 1/2010 | ............ B60W 20/13 |
| WO | WO 2012091076 | * | 7/2012 | ................ H02J 7/00 |
| WO | WO 2014122721 | * | 8/2014 | ........ G01R 31/3648 |

* cited by examiner

| AVERAGE TEMPERATURE $TB_{ave}$ | ... | -10°C ~0°C | 0°C ~10°C | 10°C ~20°C | ... |
|---|---|---|---|---|---|
| ALLOWABLE AMOUNT OF CHANGE IN CURRENT $\Delta IB_{max}$ | ... | 20A | 30A | 40A | ... |
| ALLOWABLE AMOUNT OF CHANGE IN TEMPERATURE $\Delta TB_{max}$ | ... | 5°C | 10°C | 15°C | ... |
| ALLOWABLE AMOUNT OF CHANGE IN SOC $\Delta SOC_{max}$ | ... | 4% | 6% | 8% | ... |

MP1

METHOD OF ESTIMATING DETERIORATED STATE OF SECONDARY BATTERY AND SECONDARY BATTERY SYSTEM

This nonprovisional application is based on Japanese Patent Application No. 2018-161398 filed with the Japan Patent Office on Aug. 30, 2018, the entire contents of which are hereby incorporated by reference.

BACKGROUND

Field

The present disclosure relates to a method of estimating a deteriorated state of a secondary battery and a secondary battery system using the same.

Description of the Background Art

Secondary batteries for running mounted on electrically powered vehicles which have increasingly been used in recent years may deteriorate in accordance with how they are used or an environment where they are used or with lapse of time. Therefore, highly accurate estimation of a deteriorated state of the secondary batteries has been demanded. Then, a method of estimating a deteriorated state of a secondary battery based on an impedance of the secondary battery has been proposed.

For example, according to a method disclosed in Japanese Patent Laying-Open No. 2005-221487, a current and a voltage are measured while charging and discharging currents of various waveforms without periodicity flow in a secondary battery. By subjecting the measured current and voltage to Fourier transform, an impedance for each frequency is calculated based on the current and the voltage subjected to Fourier transform.

SUMMARY

Possible factors for deterioration of a secondary battery mainly include deterioration by aging and high-rate deterioration. Deterioration by aging refers to deterioration caused by change in characteristics of materials as a secondary battery is used and time elapses. High-rate deterioration refers to deterioration caused by an uneven concentration of salt in an electrode assembly as a result of continued charging and discharging at a high current.

When use of the secondary battery is continued while high-rate deterioration has been caused, resistance of the secondary battery against overcharging may be lowered, or for example, in a lithium ion secondary battery, metal lithium may be precipitated at an electrode.

It is then desirable to carry out control in accordance with a factor for deterioration, with deterioration by aging and high-rate deterioration of a secondary battery being distinguished from each other. Conventionally, however, there has been no method of accurately distinguishing between deterioration by aging and high-rate deterioration.

The present disclosure was made to solve the problem above and an object thereof is to accurately estimate high-rate deterioration of a secondary battery.

A method of estimating a deteriorated state of a secondary battery according to the present disclosure is performed by a controller mounted on a vehicle. The method of estimating a deteriorated state of a secondary battery includes first to fifth steps. The first step is a step of obtaining a plurality of times, a voltage, a current, and a temperature of the secondary battery during a prescribed period and storing the voltage, the current, and the temperature in a memory. The second step is a step of calculating an amount of change in current of the secondary battery, an amount of change in temperature of the secondary battery, and an amount of change in SOC of the secondary battery during the prescribed period. The third step is a step of obtaining from the memory, an allowable amount of change in current representing an allowable upper limit of the amount of change in current, an allowable amount of change in temperature representing an allowable upper limit of the amount of change in temperature, and an allowable amount of change in SOC representing an allowable upper limit of the amount of change in SOC, which are determined in advance for each temperature, each current, or each SOC of the secondary battery during the prescribed period and stored in the memory, based on the temperature, the current, or the SOC of the secondary battery. The fourth step is a step of carrying out frequency conversion of the voltage and the current during the prescribed period of the secondary battery stored in the memory and calculating an impedance for each frequency band of the secondary battery based on the frequency-converted voltage and current when all of a current condition that the amount of change in current is smaller than the allowable amount of change in current, a temperature condition that the amount of change in temperature is smaller than the allowable amount of change in temperature, and an SOC condition that the amount of change in SOC is smaller than the allowable amount of change in SOC are satisfied. The fifth step is a step of estimating whether or not the secondary battery is in a high-rate deterioration state by using a ratio between an impedance corresponding to a prescribed frequency band and an impedance corresponding to another frequency band higher than the prescribed frequency band and a reference value. The prescribed frequency band is a frequency band in which at least a direct-current (DC) resistance and a reaction resistance mainly contribute.

A secondary battery system according to another aspect of the present disclosure is mounted on a vehicle. The secondary battery system includes a secondary battery and a controller including a memory and configured to estimate a deteriorated state of the secondary battery. The controller obtains a plurality of times, a voltage, a current, and a temperature of the secondary battery during a prescribed period and has the memory store the voltage, the current, and the temperature. The controller calculates an amount of change in current of the secondary battery, an amount of change in temperature of the secondary battery, and an amount of change in SOC of the secondary battery during the prescribed period. The controller obtains from the memory, an allowable amount of change in current representing an allowable upper limit of the amount of change in current, an allowable amount of change in temperature representing an allowable upper limit of the amount of change in temperature, and an allowable amount of change in SOC representing an allowable upper limit of the amount of change in SOC, which are determined in advance for each temperature, each current, or each SOC of the secondary battery during the prescribed period and stored in the memory, based on the temperature, the current, or the SOC of the secondary battery. The controller carries out frequency conversion of the voltage and the current during the prescribed period of the secondary battery stored in the memory and calculates an impedance for each frequency band of the secondary battery based on the frequency-converted voltage and current when all of a current condition that the amount of change in current is smaller than the allowable amount of change in current, a temperature condition that the amount of change in temperature is smaller than the allowable amount of change in temperature, and an SOC condition that the amount of change in SOC is smaller than the allowable amount of change in SOC are satisfied. The controller estimates whether or not the secondary battery is in a high-rate deterioration state by using a ratio between an impedance corresponding to a prescribed frequency band and an impedance corresponding to another frequency band higher than the prescribed frequency band and a reference value. The prescribed frequency band is a frequency band in which at least a DC resistance and a reaction resistance mainly contribute.

According to the method or the configuration, whether or not a secondary battery is in a high-rate deterioration state is estimated by using a ratio between an impedance corresponding to a prescribed frequency band and an impedance corresponding to another frequency band higher than the prescribed frequency band and a reference value. The present inventors have noted such characteristics that a ratio between a rate of increase in impedance from an initial stage when the secondary battery deteriorates by aging and a rate of increase in impedance from the initial stage when the secondary battery undergoes high-rate deterioration is different for each frequency band. Then, by using the characteristics to compare a ratio between an impedance corresponding to a prescribed frequency band (for example, a low frequency band) and an impedance corresponding to another frequency band (for example, a medium frequency band) with a predetermined reference value, whether or not a secondary battery is in the high-rate deterioration state can be estimated. Deterioration by aging and high-rate deterioration of the secondary battery can thus be distinguished from each other.

Each impedance used for estimating whether or not the secondary battery is in the high-rate deterioration state is calculated when all of a current condition, a temperature condition, and an SOC condition during a prescribed period are satisfied. Thus, influence of current dependency, temperature dependency, and SOC dependency of the impedance can appropriately be reflected on the impedance used for estimating whether or not a secondary battery is in the high-rate deterioration state. By using the thus calculated impedance, whether or not a secondary battery is in the high-rate deterioration state can accurately be estimated as above.

In one embodiment, the prescribed frequency band is a frequency band in which the DC resistance, the reaction resistance, and a diffusion resistance mainly contribute. Another frequency band is a frequency band in which the DC resistance and the reaction resistance mainly contribute and the diffusion resistance does not mainly contribute.

According to the method, a ratio between an impedance in a frequency band in which a DC resistance, a reaction resistance, and a diffusion resistance mainly contribute, that is, in a low frequency band, and an impedance in a frequency band in which a DC resistance and a reaction resistance mainly contribute and a diffusion resistance does not mainly contribute, that is, in a medium frequency band, is used for estimating whether or not a secondary battery is in the high-rate deterioration state. Increase in resistance due to deterioration by aging tends to appear mainly in a reaction resistance. Therefore, by using a ratio between the impedance in the medium frequency band in which a reaction resistance mainly contributes and an impedance in the low frequency band for estimating whether or not a secondary battery is in the high-rate deterioration state, whether or not the secondary battery is in the high-rate deterioration state can be estimated more accurately, for example, than in an example in which a ratio between an impedance in a high frequency band in which a reaction resistance does not mainly contribute and an impedance in the low frequency band is used.

In one embodiment, the prescribed frequency band includes a first frequency band and a second frequency band including a frequency lower than a frequency included in the first frequency band. The second frequency band exhibits such a characteristic that an impedance in the high-rate deterioration state of the secondary battery is lower than an impedance in an initial state of the secondary battery. When a ratio of an impedance corresponding to another frequency band to an impedance corresponding to the second frequency band is higher than the reference value, the secondary battery is estimated to be in the high-rate deterioration state.

The prescribed frequency band includes a first frequency band and a second frequency band including a frequency lower than a frequency included in the first frequency band. According to the characteristic described above, a ratio between a rate of increase in impedance from the initial stage in deterioration by aging of a secondary battery and a rate of increase in impedance from the initial stage in high-rate deterioration of the secondary battery is different for each frequency band. Though details will be described later, a rate of increase in impedance from the initial stage in the second frequency band in high-rate deterioration of the secondary battery is lower than the rate of increase in impedance from the initial stage in another frequency band. Then, a reference value is set in advance in consideration of an impedance corresponding to the second frequency band in the initial stage, an impedance corresponding to another frequency band in the initial stage, and a detection error of various sensors. Thus, a secondary battery can be estimated to be in the high-rate deterioration state when a value calculated based on a predetermined calculation expression (an impedance corresponding to the second frequency band being divided by an impedance corresponding to another frequency band) is greater than the reference value.

In one embodiment, restricting input to and output from the secondary battery or prohibiting use of the secondary battery, when the secondary battery is estimated to be in the high-rate deterioration state, is further included.

According to the configuration, when the secondary battery is estimated to be in the high-rate deterioration state, input to and output from the secondary battery is restricted or use of the secondary battery is prohibited. Since use of the secondary battery in the high-rate deterioration state is thus restricted, detriments such as lowering in resistance against overcharging of a secondary battery due to use of the secondary battery in the high-rate deterioration state can be suppressed.

The foregoing and other objects, features, aspects and advantages of the present disclosure will become more apparent from the following detailed description of the present disclosure when taken in conjunction with the accompanying drawings.

DESCRIPTION OF THE PREFERRED EMBODIMENTS

Figure 1:
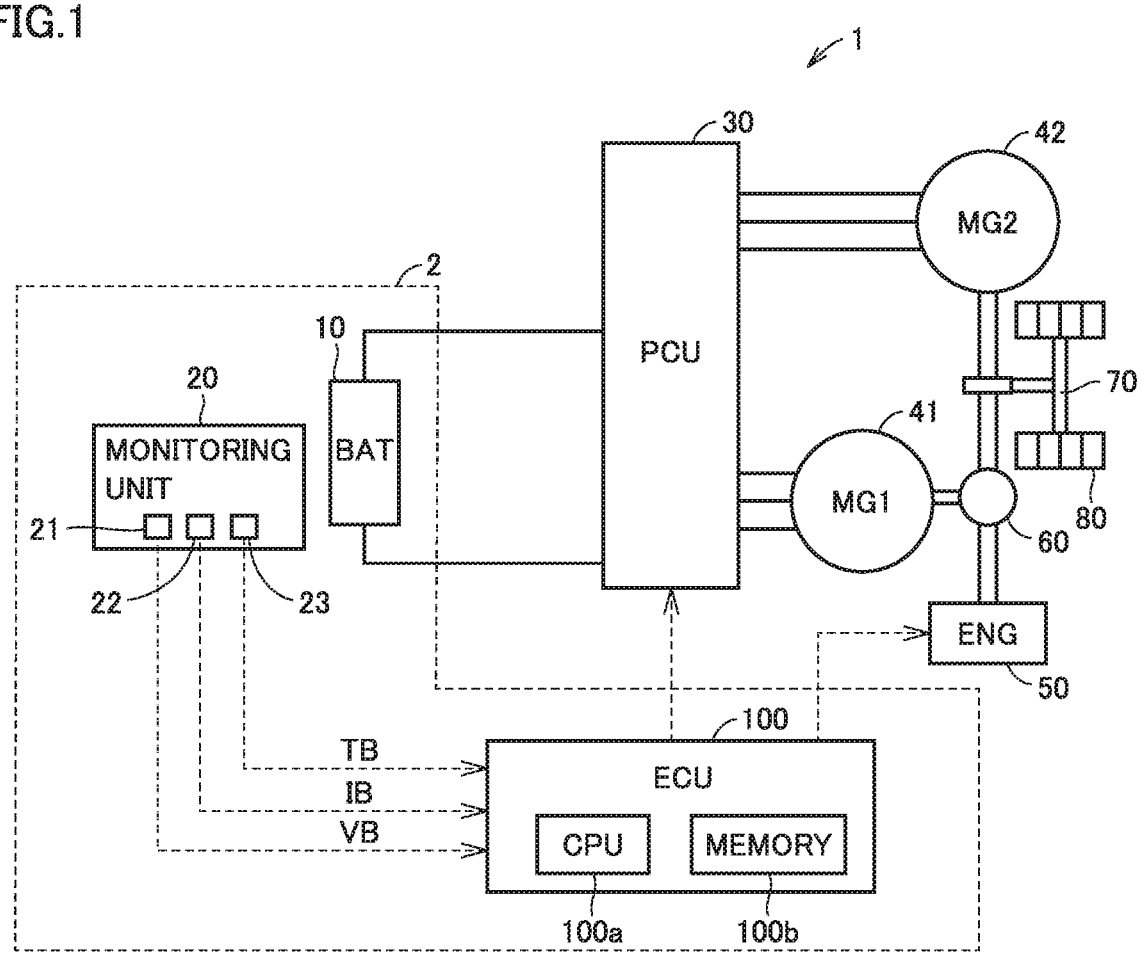
FIG. 1 is a diagram schematically showing an overall configuration of a vehicle on which a secondary battery system according to an embodiment is mounted.

The present embodiment will be described below in detail with reference to the drawings. The same or corresponding elements in the drawings have the same reference characters allotted and description thereof will not be repeated.

<Overall Configuration>

FIG. 1 is a diagram schematically showing an overall configuration of a vehicle 1 on which a secondary battery system 2 according to the present embodiment is mounted. Vehicle 1 is a vehicle which generates driving force by using electric power supplied from secondary battery system 2. In the present embodiment, an example in which vehicle 1 is a hybrid vehicle is described. Vehicle 1 should only be a vehicle which generates driving force by using electric power supplied from secondary battery system 2 and it is not limited to a hybrid vehicle. For example, vehicle 1 may be an electric vehicle, a plug-in hybrid vehicle, and a fuel cell vehicle.

Vehicle 1 includes secondary battery system 2, a power control unit (PCU) 30, motor generators 41 and 42, an engine 50, a power split device 60, a driveshaft 70, and a drive wheel 80. Secondary battery system 2 includes a battery 10, a monitoring unit 20, and an electronic control unit (ECU) 100.

Engine 50 is an internal combustion engine which outputs motive power by converting combustion energy generated at the time of combustion of an air-fuel mixture of air and fuel into kinetic energy of a motion element such as a piston and a rotor.

Power split device 60 includes, for example, a planetary gear (not shown) including three rotation axes of a sun gear, a carrier, and a ring gear. Power split device 60 splits motive power output from engine 50 into motive power for driving motor generator 41 and motive power for driving drive wheel 80.

Each of motor generators 41 and 42 is an alternating-current (AC) rotating electric machine, and it is, for example, a three-phase AC synchronous motor having a permanent magnet (not shown) embedded in a rotor. Motor generator 41 is mainly used as a power generator driven by engine 50 with power split device 60 being interposed. Electric power generated by motor generator 41 is supplied to motor generator 42 or battery 10 through PCU 30.

Motor generator 42 mainly operates as a motor and drives drive wheel 80. Motor generator 42 is driven upon receiving at least one of electric power from battery 10 and electric power generated by motor generator 41, and driving force from motor generator 42 is transmitted to driveshaft 70. During braking or deceleration on a downward slope of vehicle 1, motor generator 42 carries out regeneration by operating as the generator. Electric power generated by motor generator 42 is supplied to battery 10 through PCU 30.

PCU 30 bidirectionally converts electric power between battery 10 and motor generators 41 and 42 in response to a control signal from ECU 100. PCU 30 is configured to individually control states of motor generators 41 and 42, and for example, it can set motor generator 41 to a regenerating state (a power generating state) while it can set motor generator 42 to a power running state. PCU 30 includes, for example, two inverters provided in correspondence with motor generators 41 and 42, respectively, and a converter which boosts a DC voltage supplied to each inverter to a voltage higher than an output voltage of battery 10 (none of which is shown).

Battery 10 is a battery pack including a plurality of cells 12. Each cell 12 is, for example, a secondary battery such as a lithium ion secondary battery or a nickel-metal hydride secondary battery. In the present embodiment, an example in which cell 12 is a lithium ion secondary battery is described. Battery 10 stores electric power for driving motor generators 41 and 42 and supplies electric power to motor generators 41 and 42 through PCU 30. Battery 10 is charged upon receiving generated electric power through PCU 30 while motor generators 41 and 42 generate electric power.

Monitoring unit 20 includes a voltage sensor 21, a current sensor 22, and a temperature sensor 23. Voltage sensor 21 detects a voltage VB of battery 10. Current sensor 22 detects a current IB input to and output from battery 10. Temperature sensor 23 detects a temperature TB of battery 10. Each sensor outputs a signal indicating a result of detection to ECU 100. A configuration of battery 10 and monitoring unit 20 will be described in further detail with reference to FIG. 2.

ECU 100 includes a central processing unit (CPU) 100a, a memory (a read only memory (ROM) and a random access memory (RAM)) 100b, and an input and output port (not shown) for input and output of various signals. ECU 100 performs various types of processing for controlling vehicle 1 to a desired state based on a signal received from each sensor and a program and a map stored in memory 100b.

More specifically, ECU 100 controls charging and discharging of battery 10 by controlling engine 50 and PCU 30. ECU 100 estimates a state of charge (SOC) of battery 10. A known technique such as a current integration method and a technique using an OCV-SOC curve can be employed for estimation of an SOC. ECU 100 calculates an impedance (internal resistance) of battery 10. An impedance of battery 10 can be calculated as a ratio (=VB/IB) between voltage VB and current IB. Calculation of an impedance will be described in detail later.

Figure 2:
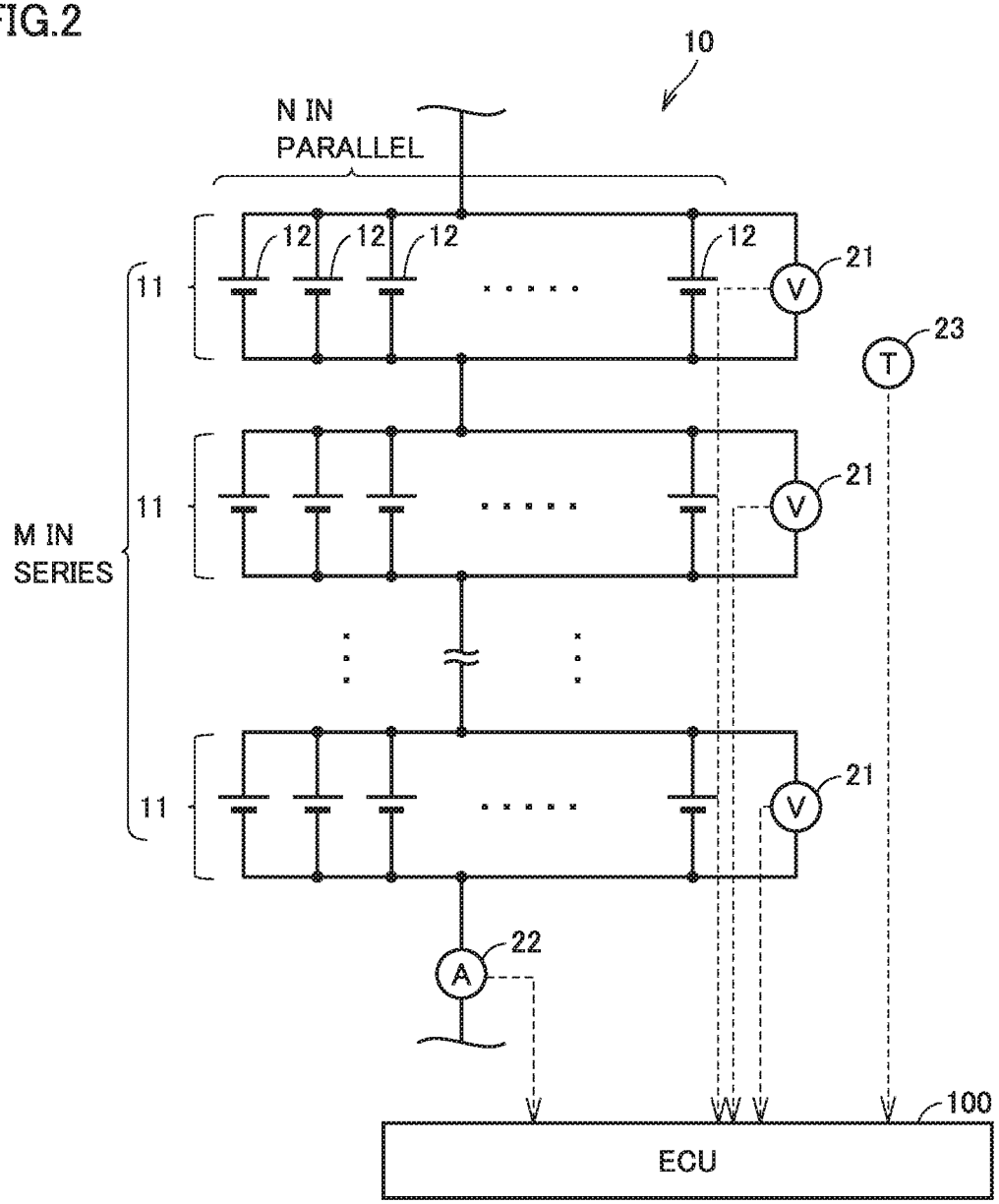
FIG. 2 is a diagram showing in further detail a configuration of a battery and a monitoring unit.

FIG. 2 is a diagram showing a configuration of battery 10 and monitoring unit 20 in further detail. Referring to FIGS. 1 and 2, battery 10 includes M blocks 11 connected in series. Each block 11 includes N cells 12 connected in parallel. M and N are natural numbers not smaller than two.

Voltage sensor 21 detects a voltage of each block 11. Current sensor 22 detects current IB which flows through all blocks 11. Temperature sensor 23 detects a temperature of battery 10. Monitoring by the voltage sensor is not limited to monitoring for each block but monitoring may be performed for each cell 12 or for each set of a plurality of adjacent cells 12 (the number of cells being smaller than the number of cells in a block). A unit to be monitored by temperature sensor 23 is not particularly limited either, and a temperature may be detected, for example, for each block (or each cell).

An internal configuration of such a battery 10 and monitoring by monitoring unit 20 are merely by way of example and not particularly limited. Therefore, a plurality of blocks 11 are not distinguished from one another or a plurality of cells 12 are not distinguished from one another below, and they are simply comprehensively denoted as battery 10. Monitoring unit 20 is described as monitoring voltage VB, current IB, and temperature TB of battery 10.

<Variation in Voltage and Current While Vehicle is Running>

While vehicle 1 configured as above is running, voltage VB, current IB, temperature TB, and an SOC of battery 10 may vary over time. Vehicle 1 "being running" should only be defined as such a state that vehicle 1 is turned on and is able to run, and may include a state that vehicle 1 temporarily stops.

Figure 3:
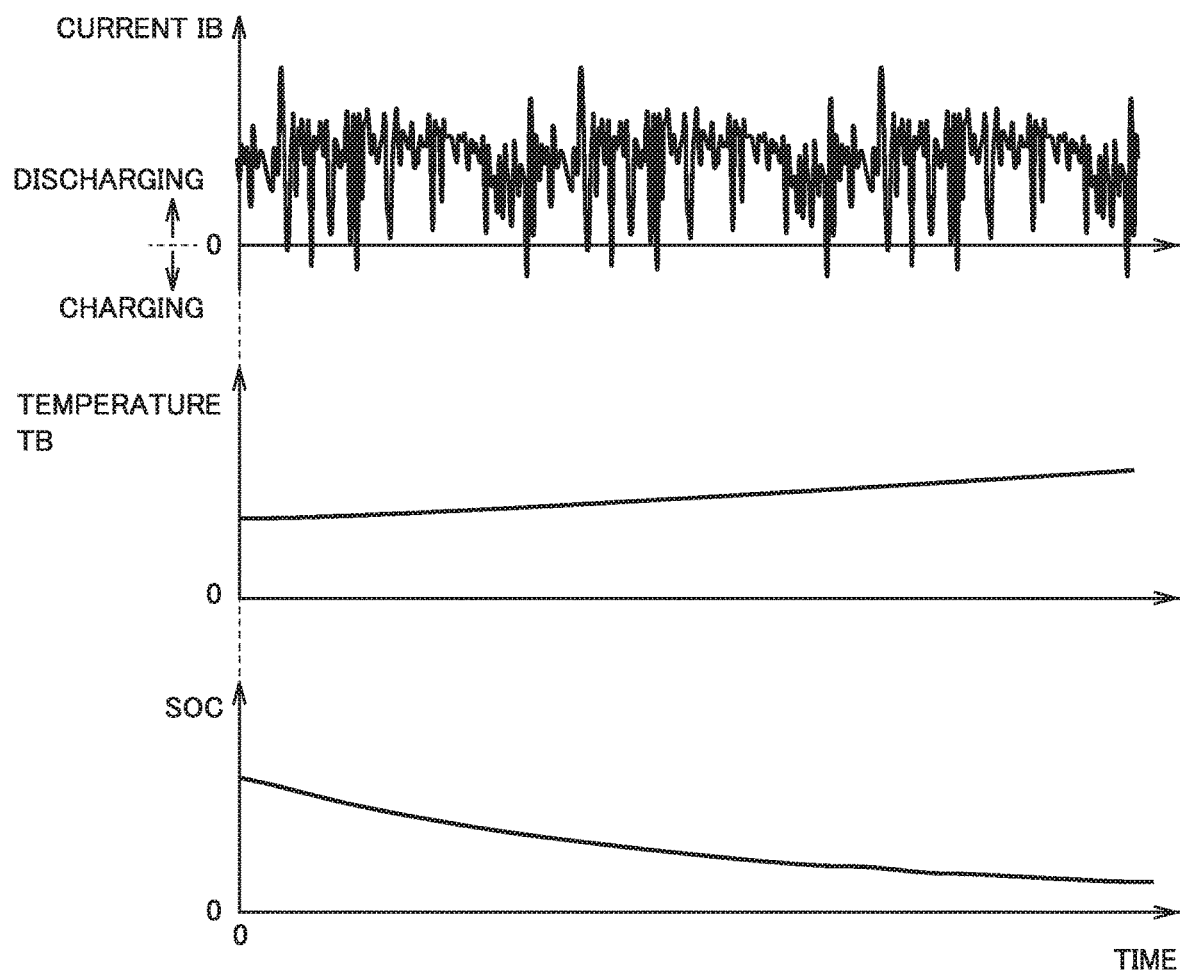
FIG. 3 is a diagram showing one example of change over time in current, temperature, and SOC of the battery while the vehicle is running.

FIG. 3 is a diagram showing one example of change over time in current IB, temperature TB, and SOC of battery 10 while vehicle 1 is running. In FIG. 3, the abscissa represents elapsed time and the ordinate represents current IB, temperature TB, and an SOC from the top. Though voltage VB may also irregularly vary similarly to current IB, voltage VB is not shown in order to prevent the drawings from becoming complicated.

Referring to FIG. 3, variation in temperature TB and SOC often takes time to some extent and temperature TB and the SOC often relatively smoothly vary. In contrast, while vehicle 1 is running, a discharging current from the battery is varied with adjustment of driving force generated by motor generator 42 or a charging current flows to battery 10 with regeneration by motor generator 42, and consequently current IB may irregularly vary. In calculation of an impedance of battery 10 based on such irregularly varying current IB, frequency dependency of an impedance is taken into account in the present embodiment as described below.

<Calculation of Impedance>

Figure 4:
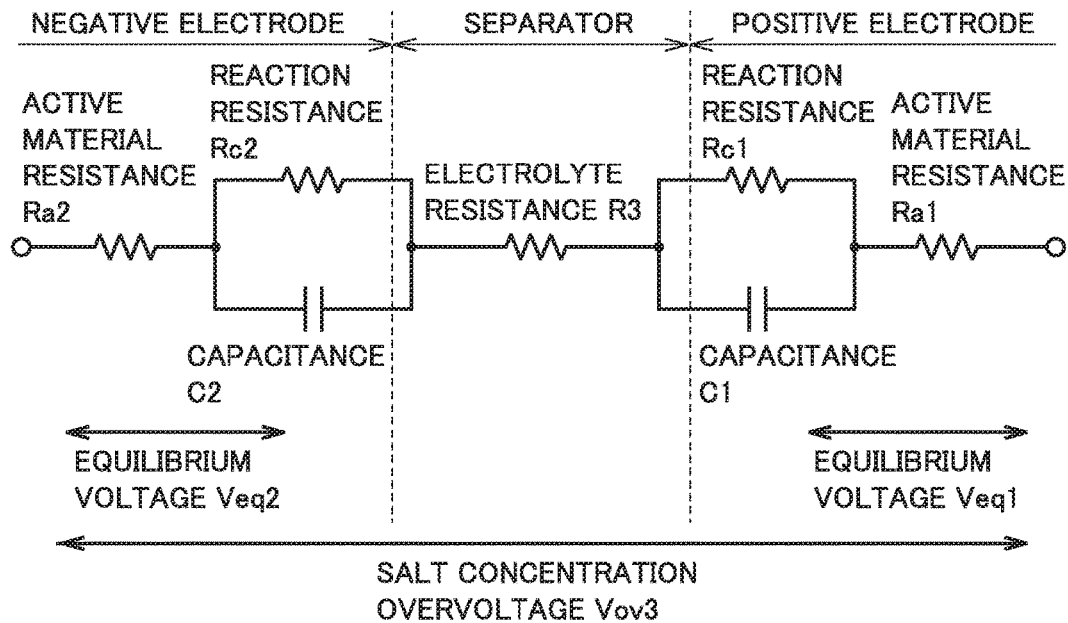
FIG. 4 is a diagram for illustrating an impedance of the battery.

FIG. 4 is a diagram for illustrating an impedance of battery 10. FIG. 4 shows one example of an equivalent circuit diagram of a positive electrode, a negative electrode, and a separator of battery 10 (more specifically, each cell 12). In general, an impedance of a secondary battery is broadly categorized into a DC resistance $R_{DC}$, a reaction resistance $R_c$, and a diffusion resistance $R_d$.

DC resistance $R_{DC}$ refers to an impedance component mainly resulting from an electronic resistance and includes an impedance component involved with ion desorption in an electrolyte and in the vicinity of each electrode. DC resistance $R_{DC}$ increases with unevenness of a distribution of a salt concentration in an electrode assembly when a high load is applied to the secondary battery (when a high voltage is applied or a high current flows). DC resistance $R_{DC}$ is represented in the equivalent circuit diagram shown in FIG. 4 as an electronic resistance Ra1 in an active material in the positive electrode, an electronic resistance Ra2 in an active material in the negative electrode, and an electrolyte resistance R3 of the separator.

Reaction resistance $R_c$ refers to an impedance component associated with supply and reception of charges (charge transfer) at the electrolyte and an active material (surfaces of a positive electrode active material and a negative electrode active material). Reaction resistance $R_c$ increases with growth of a film on an interface between the active material and the electrolyte when the secondary battery with a high SOC is in a high-temperature environment. Reaction resistance $R_c$ is represented in the equivalent circuit diagram as a resistance component Rc1 of the positive electrode and a resistance component Rc2 of the negative electrode.

Diffusion resistance $R_d$ refers to an impedance component associated with diffusion of salt in an electrode assembly or a charge transport material in the active material. Diffusion resistance $R_d$ increases with fracture of the active material when a high load is applied or unevenness of a salt concentration produced in an electrode assembly. Diffusion resistance $R_d$ is determined by an equilibrium voltage Veq1 generated at the positive electrode, an equilibrium voltage Veq2 generated at the negative electrode, and a salt concentration overvoltage Vov3 generated in the cell (an overvoltage due to production of a distribution of a salt concentration in the active material within the separator).

Various impedance components as above are thus included in the impedance of battery 10. Response time to variation in current IB is different for each impedance component. An impedance component relatively short in response time can follow variation in voltage VB at a high frequency. On the other hand, an impedance component relatively long in response time cannot follow variation in voltage VB at a high frequency. Therefore, as will be described below, for each frequency band of a low frequency band, a medium frequency band, and a high frequency band, there is an impedance component of battery 10 which mainly contributes in each frequency band.

Figure 5:
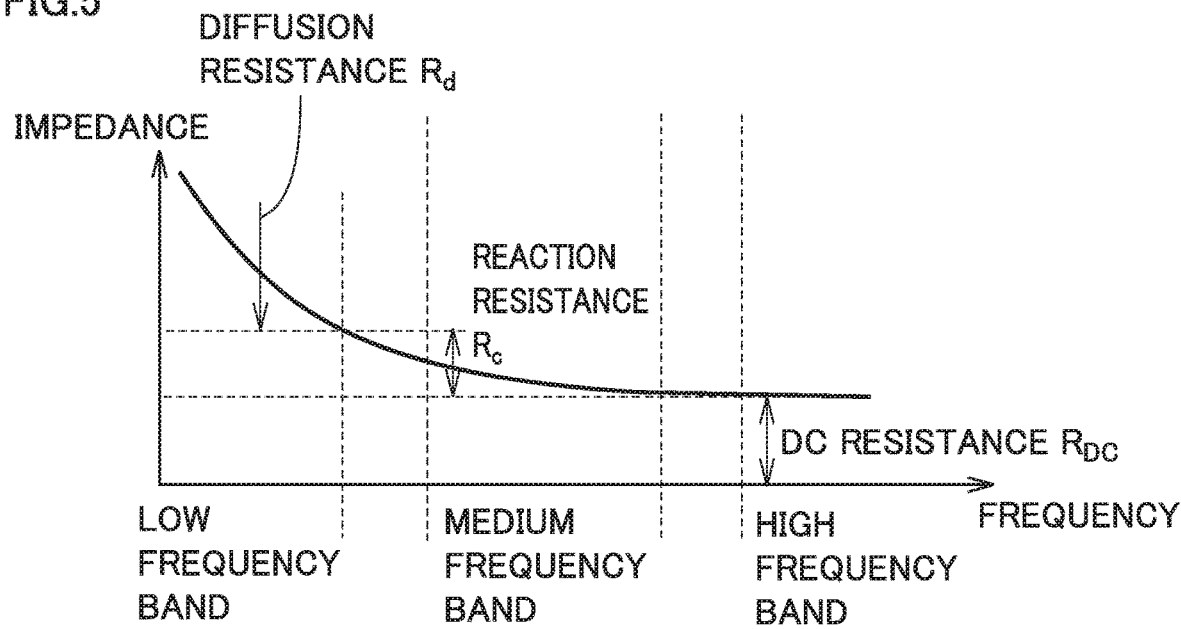
FIG. 5 is a diagram for illustrating frequency dependency of an impedance component of the battery.
Figure 9:
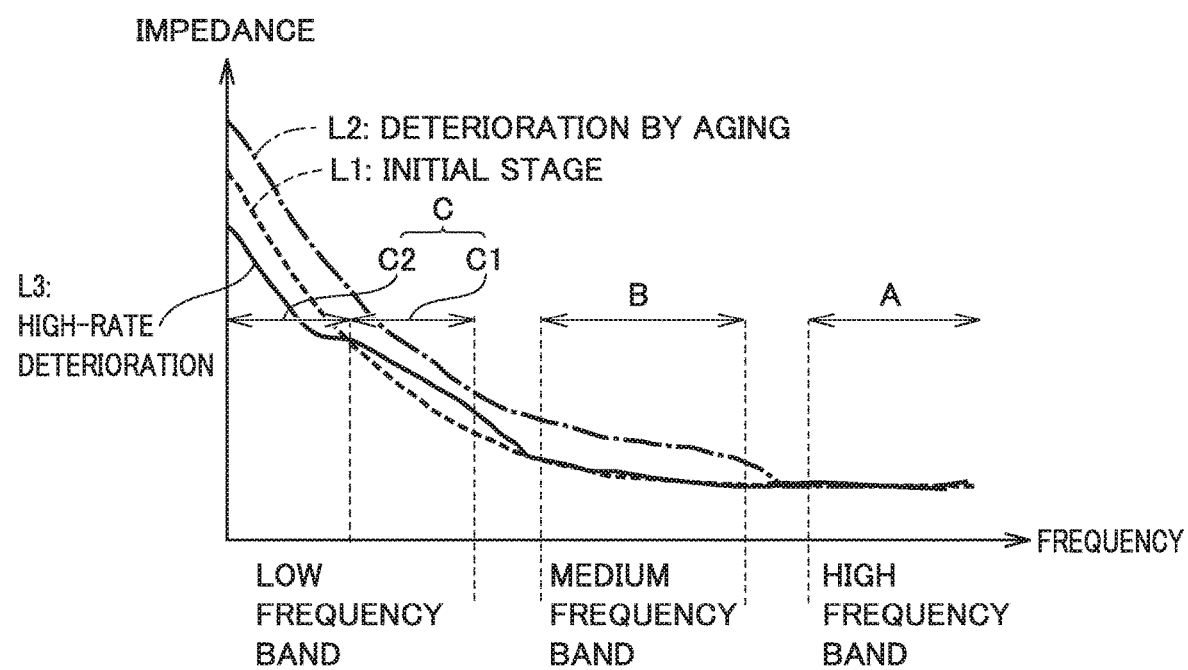
FIG. 9 is a diagram showing a result of an experiment of deterioration characteristics of a battery.

FIG. 5 is a diagram for illustrating frequency dependency of an impedance component of battery 10. In FIG. 5 and FIG. 9 which will be described later, the abscissa represents a frequency of current IB (or voltage VB) and the ordinate represents an impedance of battery 10.

An impedance measured when a frequency of current IB is included in a high frequency band is also referred to as a "high-frequency impedance ZH" below. An impedance measured when a frequency of current IB is included in a medium frequency band is also referred to as a "medium-frequency impedance ZM." An impedance measured when a frequency of current IB is included in a low frequency band is also referred to as a "low-frequency impedance ZL."

As shown in FIG. 5, in the high frequency band, DC resistance $R_{DC}$ of battery 10 mainly contributes. Namely, DC resistance $R_{DC}$ of battery 10 is mainly reflected on high-frequency impedance ZH. In the medium frequency band, reaction resistance $R_c$ and DC resistance $R_{DC}$ of battery 10 mainly contribute. Namely, reaction resistance $R_c$ and DC resistance $R_{DC}$ of battery 10 are mainly reflected on medium-frequency impedance ZM. In the low frequency band, reaction resistance $R_c$, DC resistance $R_{DC}$, and diffusion resistance $R_d$ of battery 10 mainly contribute. Namely, reaction resistance $R_c$, DC resistance $R_{DC}$, and diffusion resistance $R_d$ of battery 10 are mainly reflected on low-frequency impedance ZL. In the medium frequency band and the high frequency band, diffusion resistance $R_d$ does not mainly contribute.

<Fourier Transform>

In the present embodiment, Fourier transform is used for calculating an impedance for each frequency band (low-frequency impedance ZL, medium-frequency impedance ZM, and high-frequency impedance ZH).

Figure 6:
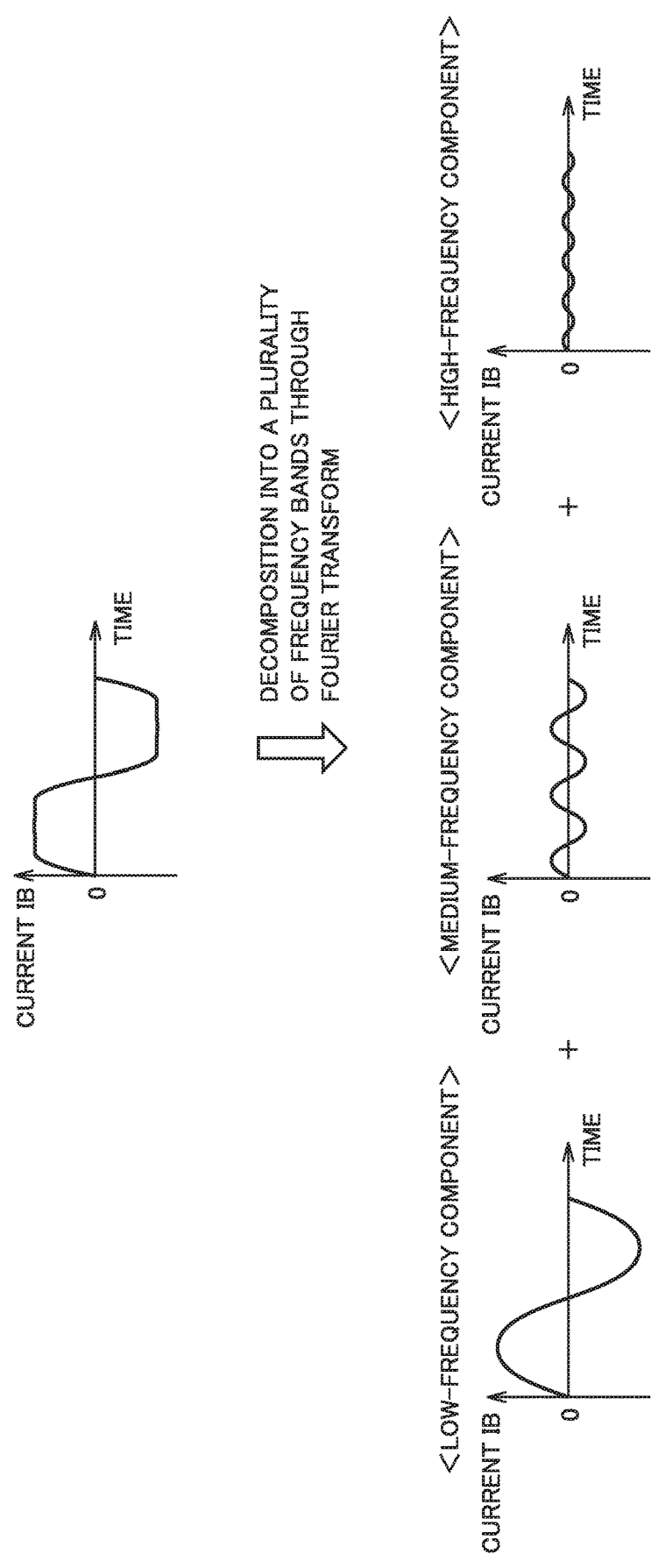
FIG. 6 is a conceptual diagram for illustrating a technique of calculating an impedance for each frequency band through Fourier transform.

FIG. 6 is a conceptual diagram for illustrating a technique of calculating an impedance for each frequency band through Fourier transform. As shown in FIG. 6, by subjecting current IB (and voltage VB) to Fourier transform, current IB can be decomposed into a low-frequency component, a medium-frequency component, and a high-frequency component. An impedance can be calculated for each frequency band based on thus decomposed voltage VB and current IB.

An example in which an impedance is calculated by subjecting voltage VB and current IB to fast Fourier transform (FFT) will be described below. An algorithm for Fourier transform is not limited to FFT, and it may be discrete Fourier transform (DFT).

Figure 7:
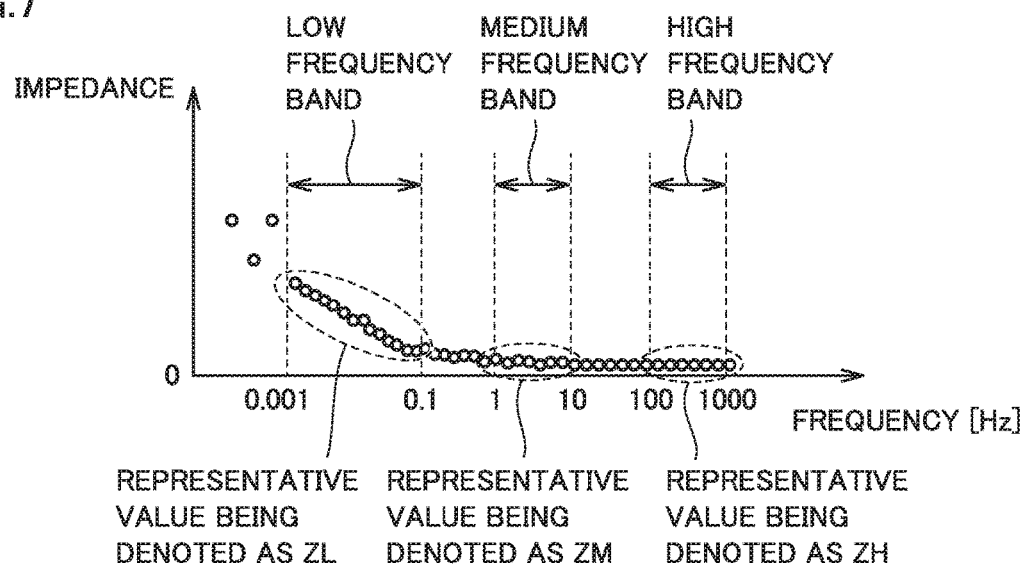
FIG. 7 is a diagram showing one example of a result of calculation of the impedance.

FIG. 7 is a diagram showing one example of a result of calculation of an impedance. In FIG. 7, the abscissa represents a frequency on a logarithmic scale. The low frequency band is defined as a frequency band, for example, not lower than 0.001 Hz and lower than 0.1 Hz. The medium frequency band is defined as a frequency band, for example, not lower than 1 Hz and lower than 10 Hz. The high frequency band is defined as a frequency band, for example, not lower than 100 Hz and lower than 1 kHz. The ordinate in FIG. 7 represents an impedance.

As shown in FIG. 7, a large number of impedances different in frequency are calculated in each frequency band. Therefore, ECU 100 determines a representative value among a large number of impedances for each of the low frequency band, the medium frequency band, and the high frequency band.

For example, when an average value of impedances is defined as the representative value, ECU 100 determines an average value of impedances in the low frequency band as low-frequency impedance ZL. ECU 100 determines an average value of impedances in the medium frequency band as medium-frequency impedance ZM. ECU 100 determines an average value of impedances in the high frequency band as high-frequency impedance ZH. Defining the average value as the representative value is by way of example and a maximum value, a median value, or a mode value of impedance components in each frequency band may be defined as the representative value.

<Data Acquisition Period>

In order to secure accuracy in FFT, data (voltage VB and current IB) repeatedly obtained every sampling period should be stored in memory 100b of ECU 100 for a certain period of time and then the data should be subjected to FFT. A period during which data is thus obtained and stored in memory 100b is also denoted as a "data acquisition period." The data acquisition period corresponds to a "prescribed period" according to the present disclosure.

An impedance of battery 10 (an impedance in each frequency band) may have dependency on a current, a temperature, and an SOC. Therefore, when any of current IB, temperature TB, and an SOC of battery 10 has excessively varied during a certain data acquisition period, an impedance may not highly accurately be calculated because Fourier transform (FFT) is carried out at once in spite of difference in influence by dependency (dependency on a current, a temperature, or an SOC) between a certain period (a period before variation) and another period (a period after variation) during the data acquisition period.

In view of such circumstances, such a condition that none of current IB, temperature TB, and an SOC of battery 10 has significantly varied during the data acquisition period is imposed on data to be subjected to FFT. Whether or not this condition is satisfied is determined based on an amount of change in current ΔIB, an amount of change in temperature ΔTB, and an amount of change in SOC ΔSOC.

Figure 8:
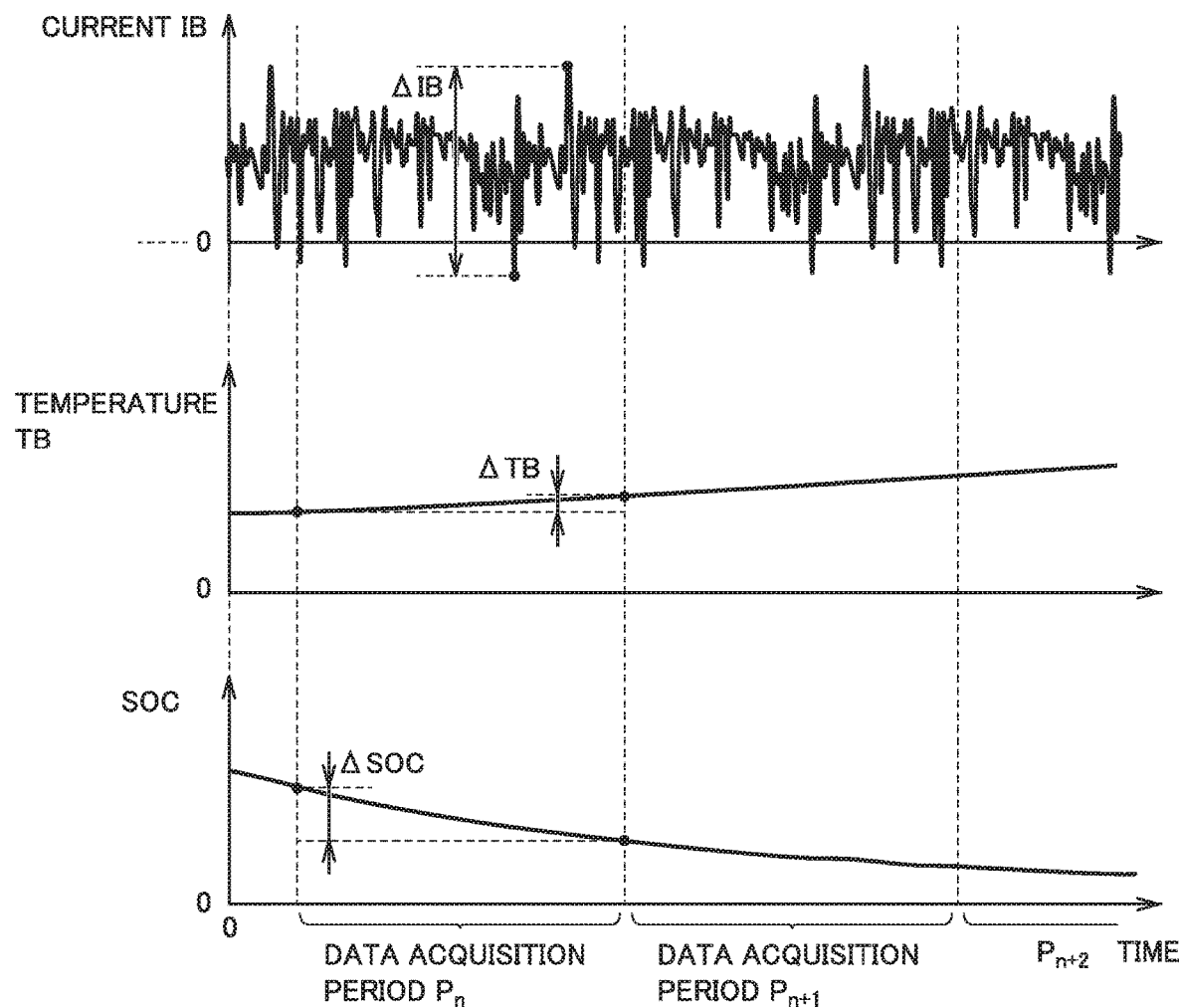
FIG. 8 is a diagram showing one example of change over time in data during a data acquisition period.

FIG. 8 is a diagram showing one example of change over time in data during a data acquisition period Pn. As shown in FIG. 8, amount of change in current ΔIB can be calculated from an amount of change in current IB (a difference between a maximum current in a direction of charging and a maximum current in a direction of discharging) in consideration of both of a direction of charging and a direction of discharging of battery 10 during a certain data acquisition period (which is denoted as data acquisition period Pn with n being a natural number). Amount of change in temperature ΔTB can be calculated based on a difference between a highest temperature (a largest value of temperature TB) and a lowest temperature (a smallest value of temperature TB) during data acquisition period Pn. Amount of change in SOC ΔSOC can be calculated based on a difference between a highest SOC and a lowest SOC during data acquisition period Pn.

When all of amount of change in current MB, amount of change in temperature ΔTB, and amount of change in SOC ΔSOC are smaller than respective corresponding allowable amounts of change (which will be described later), ECU 100 subjects data obtained during data acquisition period Pn to FFT to calculate an impedance.

<Deterioration by Aging and High-Rate Deterioration>

Possible factors for deterioration of battery 10 (a deterioration mode) mainly include deterioration by aging and high-rate deterioration. Deterioration by aging refers to deterioration caused by change in characteristics of materials as battery 10 is used and time elapses. High-rate deterioration refers to deterioration caused by unevenness of a salt concentration in an electrode assembly by continued charging and discharging at a high current. For example, when use of battery 10 is continued while high-rate deterioration has been caused, resistance of battery 10 against overcharging may be lowered or metal lithium may be precipitated at an electrode. It is then desirable to carry out control in accordance with a factor for deterioration, with deterioration by aging and high-rate deterioration of battery 10 being distinguished from each other.

The present inventors have noted such characteristics that a ratio between a rate of increase in impedance from an initial stage when battery 10 deteriorates by aging and a rate of increase in impedance from the initial stage when battery 10 undergoes high-rate deterioration is different for each frequency band. The characteristics are also referred to as "deterioration characteristics" below.

FIG. 9 is a diagram showing a result of an experiment of deterioration characteristics of battery 10. FIG. 9 shows relation between a frequency and an impedance in the initial stage of battery 10, at the time when battery 10 is used for a prescribed time period and has deteriorated by aging, and at the time when battery 10 is used for a prescribed time period and has undergone high-rate deterioration. A dashed line L1 represents relation between a frequency and an impedance of battery 10 in the initial stage. A chain dotted line L2 represents relation between a frequency and an impedance when battery 10 has deteriorated by aging. A solid line L3 represents relation between a frequency and an impedance when battery 10 has undergone high-rate deterioration.

Initially, relation between a frequency and an impedance in the initial stage of battery 10 (dashed line L1) and relation between a frequency and an impedance when battery 10 has deteriorated by aging (chain dotted line L2) are compared with each other. As shown in FIG. 9, when battery 10 has deteriorated by aging, an impedance in a high frequency band A does not substantially increase from the initial stage and it is almost the same as in the initial stage. An impedance in a medium frequency band B and a low frequency band C has increased from the initial stage and rates of increase in impedance from the initial stage in these frequency bands are substantially similar. This may be because of increase in reaction resistance due to deterioration by aging of battery 10 in these frequency bands.

Then, relation between a frequency and an impedance in the initial stage of battery 10 (dashed line L1) and relation between a frequency and an impedance when battery 10 has undergone high-rate deterioration (solid line L3) are compared with each other. As shown in FIG. 9, when battery 10 has undergone high-rate deterioration, impedances in high frequency band A and medium frequency band B are almost the same as in the initial stage. In contrast, as shown in FIG. 9, an impedance in low frequency band C is different in rate of increase from the initial stage depending on a frequency.

Specifically, low frequency band C is divided into two bands of low frequency bands C1 and C2 as shown in FIG. 9. Low frequency band C1 is a frequency band including a frequency higher than a frequency included in low frequency band C2. When battery 10 has undergone high-rate deterioration, an impedance in low frequency band C has increased from the initial stage in low frequency band C1, whereas it has decreased from the initial stage in low frequency band C2. The state above may have been caused for reasons below.

As described above, diffusion resistance $R_d$ resulting from unevenness of a distribution of a salt concentration produced in an electrode assembly is reflected on a low-frequency impedance. When battery 10 has undergone high-rate deterioration and a distribution of a salt concentration is produced in the electrode assembly, diffusion resistance $R_d$ may be reflected and the impedance in low frequency band C1 may have increased from the initial stage. It can be assumed that, in a band lower in frequency (low frequency band C2), an impedance is lower than in the initial stage due to increase in concentration of lithium ions in the electrode assembly caused by unevenness of the distribution of the salt concentration produced in the electrode assembly, that is, lowering in resistance of the electrolyte in the electrode assembly. In the following, a low-frequency impedance corresponding to low frequency band C1 is also referred to as a "low-frequency impedance ZL1" and a low-frequency impedance corresponding to low frequency band C2 is also referred to as a "low-frequency impedance ZL2." Low frequency band C1 corresponds to the "first frequency band" according to the present disclosure and low frequency band C2 corresponds to the "second frequency band" according to the present disclosure.

<Distinction Between Deterioration by Aging and High-Rate Deterioration>

In view of deterioration characteristics described above, in the present embodiment, whether or not battery 10 is in the high-rate deterioration state is estimated by calculating a ratio between a rate of increase in low-frequency impedance ZL2 from the initial stage and, for example, a rate of increase in medium-frequency impedance ZM from the initial stage. According to the deterioration characteristics, when battery 10 has deteriorated by aging, medium-frequency impedance ZM has increased from the initial stage. When battery 10 has undergone high-rate deterioration, however, medium-frequency impedance ZM has not substantially increased from the initial stage. Though low-frequency impedance ZL2 has increased from the initial stage when battery 10 has deteriorated by aging, it has decreased from the initial stage when battery 10 has undergone high-rate deterioration. By thus using an impedance in a frequency band different in rate of increase in impedance from the initial stage between deterioration by aging of battery 10 and high-rate deterioration of battery 10, whether or not battery 10 is in the high-rate deterioration state can accurately be estimated.

A rate of increase IRL in low-frequency impedance ZL2 from the initial stage is expressed in an expression (1) below by using an initial low-frequency impedance ZL20 corresponding to low frequency band C2.

$$IRL = ZL2/ZL20 \quad (1)$$

A rate of increase IRM in medium-frequency impedance ZM from the initial stage is expressed in an expression (2) below by using an initial medium-frequency impedance ZM0.

$$IRM = ZM/ZM0 \quad (2)$$

When battery 10 has deteriorated by aging, impedances in medium frequency band B and low frequency band C are substantially similar in rate of increase from the initial stage as described above, and hence a ratio between rate of increase IRM and rate of increase IRL is expected to be approximately "1". When battery 10 has undergone high-rate deterioration on the other hand, according to the deterioration characteristics, a ratio E1 between rate of increase IRM and rate of increase IRL, for example, with rate of increase IRM being defined as a numerator and rate of increase IRL being defined as a denominator, is expected to be higher than "1". Specifically, when an expression (3) is satisfied, that is, when ratio E1 (IRM/IRL) is higher than 1, battery 10 is estimated to be in the high-rate deterioration state. When ratio E1 is not higher than 1 on the other hand, battery 10 is estimated to have deteriorated by aging.

$$E1 = (IRM/IRL) > 1 \quad (3)$$

By substituting the expressions (1) and (2) into the expression (3) and deform the expression, an expression (4) can be obtained.

$$(ZM/ZL2) > (ZM0/ZL20) \quad (4)$$

The right side (ZM0/ZL20) in the expression (4) can be determined in advance based on specifications of battery 10 or measurement in the initial stage. Then, (ZM0/ZL20) is set in advance as a reference value K. An expression (5) is thus obtained. Reference value K may be set in consideration of a detection error of various sensors.

$$E = (ZM/ZL2) > K \quad (5)$$

By comparing ratio E (=ZM/ZL2) between medium-frequency impedance ZM and low-frequency impedance ZL2 with reference value K, whether or not battery 10 is in the high-rate deterioration state can be estimated as in estimation by using the expression (3). Specifically, when the expression (5) is satisfied, battery 10 can be estimated to have undergone high-rate deterioration, and when the expression (5) is not satisfied, battery 10 can be estimated to have deteriorated by aging. By thus setting reference value K, whether battery 10 is in the high-rate deterioration state or a state of deterioration by aging can be estimated by using calculated medium-frequency impedance ZM and low-frequency impedance ZL2.

<Processing Performed by ECU>

Figure 10:
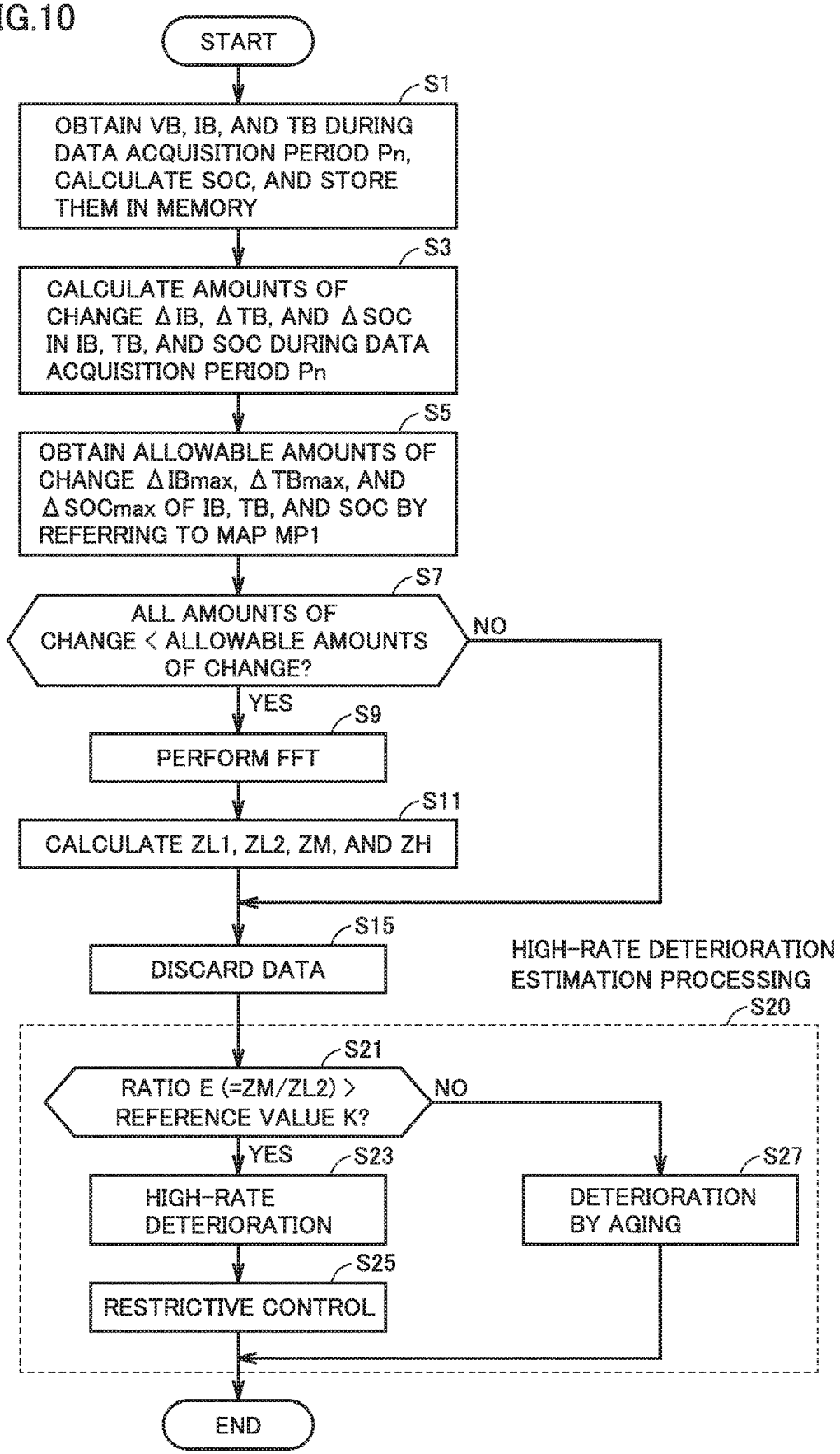
FIG. 10 is a flowchart showing one example of processing for estimating a deteriorated state of a battery performed in an ECU according to the embodiment.

FIG. 10 is a flowchart showing one example of processing for estimating a deteriorated state of battery 10 performed in ECU 100 according to the present embodiment. This flowchart is executed by being invoked from a main routine every prescribed operation period in ECU 100. Though an example in which each step in the flowchart shown in FIG. 10 is performed by software processing by ECU 100, some or all of steps may be performed by hardware (electric circuits) fabricated in ECU 100.

In a step 1 (the step being abbreviated as "S" below), ECU 100 obtains voltage VB, current IB, and temperature TB with a predetermined sampling period from each sensor in monitoring unit 20 of battery 10 during certain data acquisition period Pn. A length of data acquisition period Pn can be set, for example, approximately to several seconds to several ten seconds. A sampling period can be set, for example, to the order of milliseconds to the order of several hundred milliseconds. ECU 100 estimates an SOC of battery 10 with a prescribed period. ECU 100 has memory 100b temporarily store all data (obtained results of voltage VB, current IB, and temperature TB and a result of calculation of an SOC).

In S3, ECU 100 calculates amount of change in current $\Delta IB$ representing an amount of change in current IB during data acquisition period Pn. ECU 100 calculates amount of change in temperature $\Delta TB$ representing an amount of change in temperature TB during data acquisition period Pn. ECU 100 further calculates amount of change in SOC $\Delta SOC$ representing an amount of change in SOC of battery 10 during data acquisition period Pn.

As described with reference to FIG. 8, amount of change in current $\Delta IB$ can be calculated from an amount of change in current IB in consideration of both of a direction of charging and a direction of discharging of battery 10 during data acquisition period Pn. Amount of change in temperature $\Delta TB$ can be calculated based on a difference between a highest temperature and a lowest temperature during data acquisition period Pn. Amount of change in SOC $\Delta SOC$ can be calculated based on a difference between a highest SOC and a lowest SOC during data acquisition period Pn.

Referring back to FIG. 10, in S5, ECU 100 obtains an allowable amount of change in current $\Delta IB_{max}$ by referring to a map MP1 stored in advance in a non-volatile manner in memory 100b. Allowable amount of change in current $\Delta IB_{max}$ is a parameter serving as a criterion as to whether or not to use data stored in memory 100b in S1 for calculation of an impedance and represents an allowable upper limit of amount of change in current $\Delta IB$. ECU 100 similarly further obtains an allowable amount of change in temperature $\Delta TB_{max}$ representing an allowable upper limit of amount of change in temperature $\Delta TB$ and an allowable amount of change in SOC $\Delta SOC_{max}$ representing an allowable upper limit of amount of change in SOC $\Delta SOC$ by referring to map MP1.

Figures 11, 12:
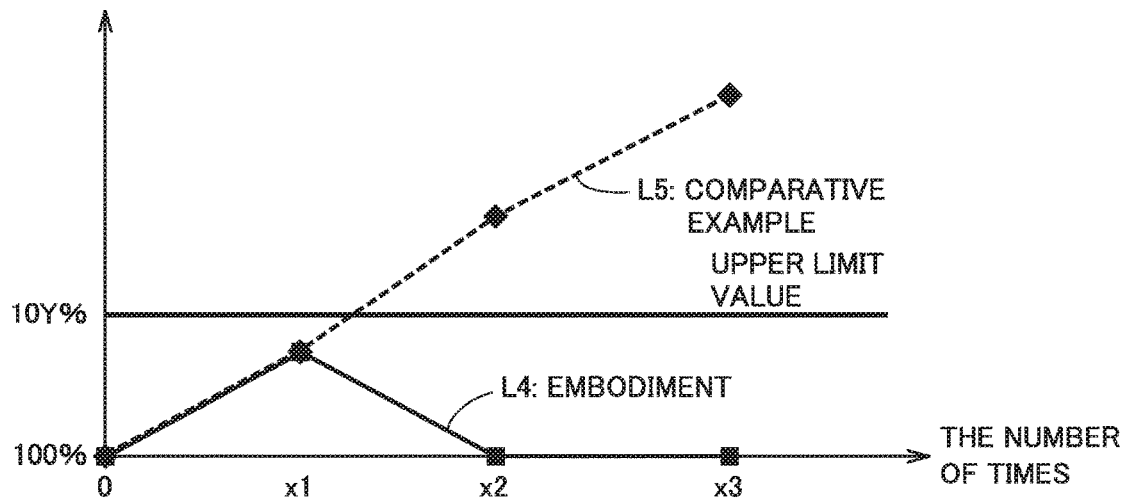
FIG. 11 is a diagram showing one example of a map MP1.
FIG. 12 is a diagram for illustrating an effect achieved by carrying out restrictive control.

FIG. 11 is a diagram showing one example of map MP1. As shown in FIG. 11, in map MP1, for each range of an average temperature $TB_{ave}$ of battery 10 during data acquisition period Pn, allowable amount of change in current $\Delta IB_{max}$, allowable amount of change in temperature $\Delta TB_{max}$, and allowable amount of change in SOC $\Delta SOC_{max}$ during data acquisition period Pn are determined. It should be noted that a specific numeric value shown in FIG. 11 is merely by way of example for facilitating understanding of map MP1.

Instead of map MP1, for example, a function or a conversion equation may be used. Instead of average temperature $TB_{ave}$, for example, a highest temperature or a lowest temperature may be employed, or a mode value of temperature TB may be employed. Though detailed description will not be repeated, instead of temperature TB (average temperature $TB_{ave}$, a highest temperature, a lowest temperature, or a mode temperature), current IB (for example, an average current, a highest current, or a lowest current) or an SOC (for example, an average SOC, a highest SOC, or a lowest SOC) may be employed. In map MP1, two or three of temperature TB, current IB, and an SOC may be used as being combined.

Referring back to FIG. 10, in S7, ECU 100 determines whether or not amount of change in current $\Delta IB$ is smaller than allowable amount of change in current $\Delta IB_{max}$. ECU 100 further determines whether or not amount of change in temperature $\Delta TB$ is smaller than allowable amount of change in temperature $\Delta TB_{max}$. ECU 100 further determines whether or not amount of change in SOC $\Delta SOC$ is smaller than allowable amount of change in SOC $\Delta SOC_{max}$.

When all of amount of change in current $\Delta IB$, amount of change in temperature $\Delta TB$, and amount of change in SOC $\Delta SOC$ are smaller than respective corresponding allowable amounts of change, that is, when a current condition of $\Delta IB<\Delta IB_{max}$ is satisfied, a temperature condition of $\Delta TB<\Delta TB_{max}$ is satisfied, and an SOC condition of $\Delta SOC<\Delta SOC_{max}$ is satisfied (YES in S7), ECU 100 subjects data (voltage VB and current IB) stored in memory 100b in S1 to FFT (S9).

Then, ECU 100 calculates an impedance for each frequency (S11). The impedance for each frequency can be calculated based on a ratio (VB/IB) between voltage VB and current IB of that frequency (see, for example, Japanese Patent Laying-Open No. 2005-221487 for a detailed equation for calculation of an impedance). ECU 100 determines a representative value among a large number of impedances for each of low frequency bands C1 and C2, medium frequency band B, and high frequency band A and calculates low-frequency impedances ZL1 and ZL2, medium-frequency impedance ZM, and high-frequency impedance ZH.

After an impedance in each frequency band is calculated, ECU 100 discards (erases) data stored in memory 100b (S15).

When at least any one of amount of change in current $\Delta IB$, amount of change in temperature $\Delta TB$, and amount of change in SOC $\Delta SOC$ is equal to or greater than a corresponding allowable amount of change in S7, that is, at least one relational expression of $\Delta IB \geq \Delta IBmax$, $\Delta TB \geq \Delta TBmax$, and $\Delta SOC \geq \Delta SOCmax$ is satisfied (NO in S7), ECU 100 skips processing in S9 and S11 and the process proceeds to S15 where data stored in memory 100b is discarded.

ECU 100 performs processing for estimating whether or not battery 10 is in the high-rate deterioration state based on the impedance in each frequency band calculated in S11 (S20). This processing is also referred to as "high-rate deterioration estimation processing" below.

Specifically, ECU 100 determines whether or not ratio E (=ZM/ZL2) between medium-frequency impedance ZM and low-frequency impedance ZL2 is higher than reference value K (S21). When ratio E is higher than reference value K (YES in S21), ECU 100 estimates that battery 10 is in the high-rate deterioration state (S23) and carries out restrictive control (S25).

Restrictive control refers to control for restricting input to and output from battery 10 or prohibiting use of battery 10. Since use of battery 10 in the high-rate deterioration state is restricted under restrictive control, lowering in resistance against overcharging of battery 10 due to use of battery 10 in the high-rate deterioration state can be suppressed or precipitation of metal lithium at an electrode can be suppressed.

When ratio E is not higher than reference value K (NO in S21), ECU 100 estimates that battery 10 has deteriorated by aging (S27). When the battery has deteriorated by aging, ECU 100 does not carry out restrictive control but quits the process.

As set forth above, in the present embodiment, attention is paid to such characteristics (deterioration characteristics) that a ratio between a rate of increase in impedance from the initial stage in deterioration by aging of battery 10 and a rate of increase in impedance from the initial stage in high-rate deterioration of battery 10 is different for each frequency band. Then, whether or not battery 10 is in the high-rate deterioration state is estimated by using the deterioration characteristics. Specifically, by using the deterioration characteristics to compare ratio E between low-frequency impedance ZL2 corresponding to low frequency band C2 and medium-frequency impedance ZM corresponding to medium frequency band B with predetermined reference value K, deterioration by aging and high-rate deterioration of battery 10 can be distinguished from each other.

Each impedance used for estimation as to whether or not battery 10 is in the high-rate deterioration state is calculated when all of a current condition, a temperature condition, and an SOC condition during data acquisition period Pn are satisfied. Thus, influence of current dependency, temperature dependency, and SOC dependency of an impedance can appropriately be reflected on the impedance used for estimation as to whether or not battery 10 is in the high-rate deterioration state. By using the thus calculated impedance, whether or not battery 10 is in the high-rate deterioration state can accurately be estimated.

When battery 10 is estimated to be in the high-rate deterioration state, restrictive control is carried out. Use of battery 10 when battery 10 is in the high-rate deterioration state is thus restricted. Therefore, lowering in resistance against overcharging of battery 10 due to use of battery 10 in the high-rate deterioration state can be suppressed and precipitation of metal lithium at an electrode can be suppressed.

<Effect of Restrictive Control>

FIG. 12 is a diagram for illustrating an effect achieved by carrying out restrictive control. FIG. 12 shows a result of an experiment of calculation of an internal resistance of battery 10 from voltage variation when a certain constant current is fed for a certain period of time when an SOC of battery 10 is set to a certain SOC at a room temperature (for example, 25 degrees). The internal resistance includes DC resistance $R_{DC}$, reaction resistance $R_c$, and diffusion resistance $R_d$, and which resistance (DC resistance $R_{DC}$, reaction resistance $R_c$, and diffusion resistance $R_d$) mainly contributes may be varied by a temperature or the like of battery 10. The abscissa in FIG. 12 represents the number of times of processing performed in the flowchart shown in FIG. 10 and the ordinate represents a rate of increase in internal resistance. A solid line L4 in FIG. 12 represents a rate of increase in internal resistance when restrictive control is carried out (embodiment) and a dashed line L5 represents a rate of increase in internal resistance when restrictive control is not carried out (comparative example).

The rate of increase in internal resistance refers to a rate of increase in internal resistance of battery 10 from the initial stage. An upper limit value shown in FIG. 12 is a value indicating an allowable upper limit of the rate of increase in internal resistance, and it is set, for example, to 10Y % (>100%).

Referring to FIG. 12, when restrictive control is not carried out (comparative example), the rate of increase in internal resistance increases as battery 10 is used and time elapses, and the rate of increase exceeds the upper limit value. In contrast, when restrictive control is carried out (embodiment), restrictive control is activated at the time point when the rate of increase in internal resistance increases and battery 10 is estimated to be in the high-rate deterioration state (the time point of the number of times X1). Use of battery 10 is thus restricted. Since high-rate deterioration is then relaxed with lapse of time, the rate of increase in internal resistance lowers and the rate of increase in internal resistance returns to 100% at the time point of the number of times X2. The rate of increase in internal resistance can thus be not higher than the upper limit value by carrying out restrictive control.

First Modification

In the embodiment, high-rate deterioration of battery 10 is estimated by comparing ratio E (=ZM/ZL2) between medium-frequency impedance ZM (or high-frequency impedance ZH) as a numerator and low-frequency impedance ZL2 as a denominator with reference value K. Ratio E, however, is not limited as such, and for example, low-frequency impedance ZL2 may be defined as a numerator and medium-frequency impedance ZM may be defined as a denominator.

In the example above, whether or not battery 10 is in the high-rate deterioration state is estimated, for example, by comparing a ratio E2 (=ZL2/ZM) between low-frequency impedance ZL2 and medium-frequency impedance ZM with a reference value K1 as expressed in an expression (6). Similarly to reference value K, reference value K1 is appropriately set in consideration of a ratio (ZL20/ZM0) between initial low-frequency impedance ZL20 and initial medium-frequency impedance ZM0 and a detection error of various sensors.

$$E2=(ZL2/ZM)<K1 \tag{6}$$

When ratio E2 is lower than reference value K1, battery 10 is estimated to be in the high-rate deterioration state. When ratio E2 is not lower than reference value K1, battery 10 is estimated to have deteriorated by aging.

In the modification as well, as in the embodiment, deterioration by aging and high-rate deterioration of battery 10 can be distinguished from each other. Therefore, whether or not battery 10 is in the high-rate deterioration state can accurately be estimated.

Second Modification

In the embodiment and the first modification, an example in which the high-rate deterioration state of battery 10 is estimated by comparing ratio E (or ratio E2) between low-frequency impedance ZL2 corresponding to low frequency band C2 and medium-frequency impedance ZM corresponding to medium frequency band B with predetermined reference value K (or reference value K1) in view of the deterioration characteristics is described. Estimation of the high-rate deterioration state of battery 10, however, is not limited to estimation by using a ratio between the two impedances. The ratio used for estimating the high-rate deterioration state of battery 10 should only include at least one impedance corresponding to a frequency band different in rate of increase from the initial stage between deterioration by aging of battery 10 and high-rate deterioration of battery 10 in deterioration characteristics.

For example, specifically, for estimation of the high-rate deterioration state of battery 10, a ratio between low-frequency impedance ZL2 corresponding to low frequency band C2 and low-frequency impedance ZL1 corresponding to low frequency band C1 may be used, a ratio between low-frequency impedance ZL2 and high-frequency impedance ZH corresponding to high frequency band A may be used, or a ratio between low-frequency impedance ZL1 and high-frequency impedance ZH may be used. Alternatively, for estimation of the high-rate deterioration state of battery 10, a ratio between medium-frequency impedance ZM corresponding to medium frequency band B and high-frequency impedance ZH may be used.

In the example above as well, as in the embodiment, a reference value can be set in advance based on the specifications of battery 10 or measurement in the initial stage. Alternatively, a reference value may be set in consideration of a detection error of various sensors.

Though an embodiment of the present disclosure has been described, it should be understood that the embodiment disclosed herein is illustrative and non-restrictive in every respect. The scope of the present disclosure is defined by the terms of the claims and is intended to include any modifications within the scope and meaning equivalent to the terms of the claims.

What is claimed is:

1. A method of estimating a deteriorated state of a secondary battery performed by a controller mounted on a vehicle, the method comprising:
    obtaining a plurality of times, a voltage, a current, and a temperature of the secondary battery during a prescribed period and storing the voltage, the current, and the temperature in a memory;
    calculating an amount of change in current of the secondary battery, an amount of change in temperature of the secondary battery, and an amount of change in SOC of the secondary battery during the prescribed period;
    obtaining from the memory, an allowable amount of change in current, an allowable amount of change in temperature, and an allowable amount of change in SOC, which are determined in advance for each temperature, each current, or each SOC of the secondary battery during the prescribed period and stored in the memory, based on the temperature, the current, or the SOC of the secondary battery, the allowable amount of change in current representing an allowable upper limit of the amount of change in current, the allowable amount of change in temperature representing an allowable upper limit of the amount of change in temperature, the allowable amount of change in SOC representing an allowable upper limit of the amount of change in SOC;
    carrying out frequency conversion of the voltage and the current during the prescribed period of the secondary battery stored in the memory and calculating an impedance for each frequency band of the secondary battery based on the frequency-converted voltage and current when all of a current condition, a temperature condition, and an SOC condition are satisfied, the current condition being a condition that the amount of change in current is smaller than the allowable amount of change in current, the temperature condition being a condition that the amount of change in temperature is smaller than the allowable amount of change in temperature, the SOC condition being a condition that the amount of change in SOC is smaller than the allowable amount of change in SOC; and
    estimating whether the secondary battery is in a high-rate deterioration state by using a ratio between an impedance corresponding to a prescribed frequency band and an impedance corresponding to another frequency band higher than the prescribed frequency band and a reference value,
    the prescribed frequency band being a frequency band in which at least a direct-current (DC) resistance and a reaction resistance mainly contribute.

2. The method according to claim 1, wherein
    the prescribed frequency band is a frequency band in which the DC resistance, the reaction resistance, and a diffusion resistance mainly contribute, and
    the another frequency band is a frequency band in which the DC resistance and the reaction resistance mainly contribute and the diffusion resistance does not mainly contribute.

3. The method according to claim 2, wherein
    the prescribed frequency band includes a first frequency band and a second frequency band lower than the first frequency band,
    the second frequency band exhibits such a characteristic that an impedance in the high-rate deterioration state of the secondary battery is lower than an impedance in an initial state of the secondary battery, and
    when a ratio of the impedance corresponding to the another frequency band to an impedance corresponding to the second frequency band is higher than the reference value, the secondary battery is estimated to be in the high-rate deterioration state.

4. The method according to claim 3, further comprising restricting input to and output from the secondary battery or prohibiting use of the secondary battery, when the secondary battery is estimated to be in the high-rate deterioration state.

5. A secondary battery system mounted on a vehicle, the secondary battery system comprising:
    a secondary battery; and
    a controller including a memory and configured to estimate a deteriorated state of the secondary battery,
    the controller being configured to
        obtain a plurality of times, a voltage, a current, and a temperature of the secondary battery during a prescribed period and store the voltage, the current, and the temperature in the memory,
        calculate an amount of change in current of the secondary battery, an amount of change in temperature of the secondary battery, and an amount of change in SOC of the secondary battery during the prescribed period,
        obtain from the memory, an allowable amount of change in current, an allowable amount of change in temperature, and an allowable amount of change in SOC, which are determined in advance for each temperature, each current, or each SOC of the secondary battery during the prescribed period and stored in the memory, based on the temperature, the current, or the SOC of the secondary battery, the allowable amount of change in current representing an allowable upper limit of the amount of change in current, the allowable amount of change in temperature representing an allowable upper limit of the amount of change in temperature, the allowable amount of change in SOC representing an allowable upper limit of the amount of change in SOC, carrying out frequency conversion of the voltage and the current during the prescribed period of the secondary battery stored in the memory and calculating an impedance for each frequency band of the secondary battery based on the frequency-converted voltage and current when all of a current condition, a temperature condition, and an SOC condition are satisfied, the current condition being a condition that the amount of change in current is smaller than the allowable amount of change in current, the temperature condition being a condition that the amount of change in temperature is smaller than the allowable amount of change in temperature, the SOC condition being a condition that the amount of change in SOC is smaller than the allowable amount of change in SOC, and estimate whether the secondary battery is in a high-rate deterioration state by using a ratio between an impedance corresponding to a prescribed frequency band and an impedance corresponding to another frequency band higher than the prescribed frequency band and a reference value, the prescribed frequency band being a frequency band in which at least a DC resistance and a reaction resistance mainly contribute.

* * * * *